United States Patent [19]

Nakamura et al.

[11] Patent Number: 4,752,728
[45] Date of Patent: Jun. 21, 1988

[54] TUNABLE RESONANT SENSING MEANS TO SENSE A PARTICULAR FREQUENCY IN A HIGH ENERGY CHARGED PARTICLE BEAM AND GENERATE A FREQUENCY-DOMAIN SIGNAL IN RESPONSE

[75] Inventors: Michiyuki Nakamura, Pleasant Hill; Marvin L. Nolan, Fairfield, both of Calif.

[73] Assignee: The United States of America as represented by the United States Department of Energy, Washington, D.C.

[21] Appl. No.: 909,669

[22] Filed: Sep. 22, 1986

[51] Int. Cl.[4] .............................................. G01N 27/02
[52] U.S. Cl. .................................. 324/71.3; 324/57 Q; 324/58 R; 324/58.5 R; 324/318; 334/71; 333/235
[58] Field of Search .................... 250/396 R, 396 ML; 324/57 Q, 58 C, 58.5 C, 59, 60 R, 61 QS, 207, 71.1, 71.3, 409, 300, 307, 309, 313, 318, 322; 333/219, 227, 231, 235; 334/41, 42, 43, 45, 71

[56] References Cited

U.S. PATENT DOCUMENTS

| | | | |
|---|---|---|---|
| 1,622,389 | 3/1927 | Miessner | 334/61 |
| 2,513,393 | 7/1950 | Frey et al. | 334/41 |
| 2,558,482 | 6/1951 | Galitz | 334/53 |
| 2,601,338 | 6/1952 | Snyder | 334/66 |
| 2,694,150 | 11/1954 | Bussard | 334/3 |
| 2,803,804 | 8/1957 | Kihn | 333/205 |
| 2,952,771 | 9/1960 | Lytle | 334/73 |
| 3,378,795 | 4/1968 | Harris et al. | 334/65 |
| 3,573,834 | 4/1971 | McCabe et al. | 343/769 |
| 3,588,902 | 6/1971 | Willie et al. | 343/745 |
| 3,857,090 | 12/1974 | Chick | 250/397 |
| 4,060,762 | 11/1977 | McKeown | 324/71.1 |
| 4,066,988 | 1/1978 | Karp | 334/41 |
| 4,134,017 | 1/1979 | Azam et al. | 250/396 R |
| 4,313,121 | 1/1982 | Campbell et al. | 343/790 |
| 4,620,155 | 10/1986 | Edelstein | 324/322 |
| 4,658,153 | 4/1987 | Brosh et al. | 361/179 X |

Primary Examiner—A. D. Pellinen
Assistant Examiner—H. L. Williams
Attorney, Agent, or Firm—Clifton E. Clouse, Jr.; Roger S. Gaither; Judson R. Hightower

[57] ABSTRACT

A frequency domain sensing system is disclosed for sensing the position of a high energy beam of charged particles traveling within a housing which comprises a plurality of sensors positioned in the wall of the housing radially around the axis of the beam. Each of the sensors further comprises a first electrode of predetermined shape received in a bore in the housing to define a fixed capacitance and an inductance structure attached to the electrode to provide an inductance for the sensing means which will provide an LC circuit which will resonate at a predetermined frequency known to exist in the beam of charged particles. The sensors are further provided with tuning apparatus associated with the inductance structure to vary the amount of the inductance to thereby tune the sensors to the predetermined frequency prior to transmission of the signal to signal detection circuitry.

10 Claims, 4 Drawing Sheets

TUNABLE RESONANT SENSING MEANS TO SENSE A PARTICULAR FREQUENCY IN A HIGH ENERGY CHARGED PARTICLE BEAM AND GENERATE A FREQUENCY-DOMAIN SIGNAL IN RESPONSE

BACKGROUND OF THE INVENTION

The Government has rights in this invention pursuant to Contract No. DE-AC03-76SF00098 between the U.S. Department of Energy and the University of California.

This invention relates to a tunable sensing means to sense the location of a high energy charged particle beam. More particularly, this invention relates to such a sensing means having built in means to vary the inductance of the sensing means to tune the sensing means to a particular desired frequency.

Intense beams of light of X-ray frequency may be generated from a beam of electrons or positrons traveling in a storage ring such as a synchrotron light storage ring. The passage of the beam of charged particles through the storage ring is controlled by various electrodes and magnet means arranged to accelerate and/or focus or steer the beam. However, to accurately control the beam, it is important to be able to sense the location of the beam.

Chick U.S. Pat. No. 3,857,090 entitled GENERATION OF BEAMS OF CHARGED PARTICLES discloses an apparatus and methods for monitoring a beam of charged particles using a toroidal coil or series of coils arranged radially around the beam path. A plurality of the output signals may be derived from a number of coil positions spaced around the beam to enable any deviation of the beam from the desired path to be determined.

In other systems currently employed for monitoring beam position, four pickup tubes, flush mounted radially around the wall of the tube carrying the beam, provide time domain pulses with a magnitude related to the nearness of the beam. However, the time pulse magnitude, in view of the total energy of the beam, can be much too high to operate a conventional feedback system. Furthermore, bunch lengths varying from 35 picoseconds to 1 nanosecond have Fourier components extending to many gigahertz, causing discontinuities and reflection voltages in signal cables. The wide range of frequencies and the high energy of the beam complicate the filtering of a signal pulse prior to feeding it to detection means.

The many disadvantages of time-domain pickup electrodes have encouraged those skilled in the art to seek alternate systems, such as frequency-domain beam monitors, where the monitor signals are high frequency voltage bursts. Such high frequency signals must be tunable in order to pass through band pass filters and to resonate with the tuned circuit at the receiving end of the signal cable.

A tuned signal would obviate many disadvantages of conventional pulses in that the quality of the connecting cables and connectors could be minimized when dealing with a single known frequency. Also since the voltage output from the electrode can be quite high, too high to use with conventional circuitry for measurement or feedback control, the use of a resonant circuit would be preferred because the amplitude of the signal would be reduced.

It would, therefore, be desirable to sense a particular frequency component of the beam to determine the position of the beam. K. Wille, in an article published in the IEEE Transaction on Nuclear Science, Volume NS-26, No. 3, in June, 1979 on pages 3281-3282 entitled DAMPING OF COHERENT TRANSVERSE OSCILLATIONS IN PETRA, describes a beam position monitoring system for a storage ring utilizing pickup electrodes and a transformer consisting of a shortened half wavelength coaxial resonator with two capacitive loads at both ends. One capacitor is described as the pickup electrode and the second one is tunable in order to adjust the desired resonant frequency.

Tuning devices which are provided in a circuit to vary either an inductance or a capacitance to tune a circuit are known. Typical of prior art teachings of the use of variable inductors or capacitors are those found in Galitz U.S. Pat. No. 2,558,482; Snyder U.S. Pat. No. 2,601,338; Kihn U.S. Pat. No. 2,803,804; Lytle U.S. Pat. No. 2,952,771; McCabe et al U.S. Pat. No. 3,573,834; Willie et al U.S. Pat. No. 3,588,902; and Campbell et al U.S. Pat. No. 4,313,121.

It is also known to provide such devices with a variable inductor comprising a spiral inductance line wherein the inductance in the spiral line may be changed, usually by moving another element relative to the spiral inductor. For example, Miessner U.S. Pat. No. 1,622,389 shows an electrical inductive and capacitive element comprising a concentrated flat spiral winding and means for varying the inductance of the winding comprising a disc of conducting material parallel to the winding.

Frey, Jr. et al U.S. Pat. No. 2,513,393 describes a tuner for high frequency signals including a lumped inductance and an inductance in strip form. A movable contact is arranged so that continued movement of the contact away from the lumped inductance and in contact with the distributed inductance causes a gradually increasing inductive effect of the lumped inductance sensitivity to be augmented by that portion of the strip inductance increasingly included with the lumped inductance.

Bussard U.S. Pat. No. 2,694,150 shows a tuner which includes a spiral inductor and a contact arm which may be rotated on a shaft to short-circuit a variable portion of the spiral inductor to tune the device.

Harris et al U.S. Pat. No. 3,378,795 discloses a variable inductor comprising a plurality of arcuate conductive turns in series with one another with a conductive wiper mounted for relative rotation with respect to the conductive turns in contact with one of the turns to progressively short out an increasing portion of the turn as it is rotated.

However, It would to be desirable to be able to sense a particular frequency component of the beam to determine the position of the beam with a sensing means provided with its own self-contained tuning means to permit the sensing means to selectively transmit only the preselected frequency for which the sensing means has been tuned.

SUMMARY OF THE INVENTION

It is therefore an object of this invention to provide a frequency tunable sensing means for sensing the position of a beam of charged particles.

It is another object of the invention to provide tuning means associated directly with the sensing means to tune the sensing means by varying the inductance of an inductance means associated with the sensing means.

It is yet another object of the invention to provide variable inductance means comprising a plurality of serpentine inductors electrically in parallel and means for rotationally engaging the inductors along the serpentine path to vary the effective length of the serpentine inductors.

These and other objects of the invention will be apparent from the following description and accompanying drawings.

DETAILED DESCRIPTION OF THE INVENTION

Figure 1:
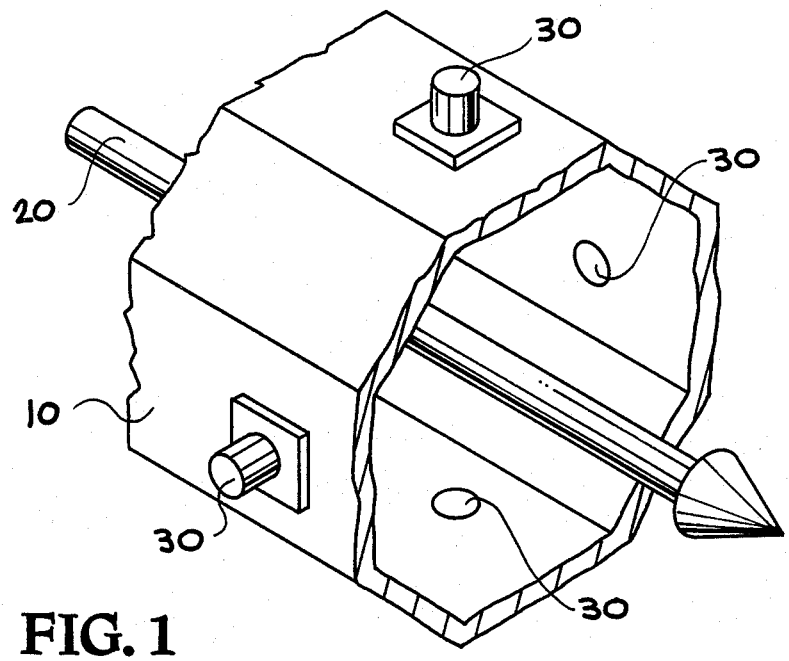
FIG. 1 is an isometric view of a section of the housing in which the beam to be detected travels depicting the positioning of a plurality of the sensing means of the invention.

Turning now to FIG. 1, a section of a typical vacuum beam pipe or tube 10 of a storage ring is shown in which a charged particle beam 20 such as an electron beam is stored with a series of the sensing means 30 of the invention disposed radially around beam pipe 10 to determine the position of the beam at that point along the path of the beam. Since beam 20 wiggles or oscillates as it proceeds around the storage ring in what is known as betatron oscillation, it is common to place a number of such sensing points along one period of the beam oscillation so that with appropriate electronic circuitry, the average or mean path of beam 20, independent of the oscillations, may be determined.

Figure 7:
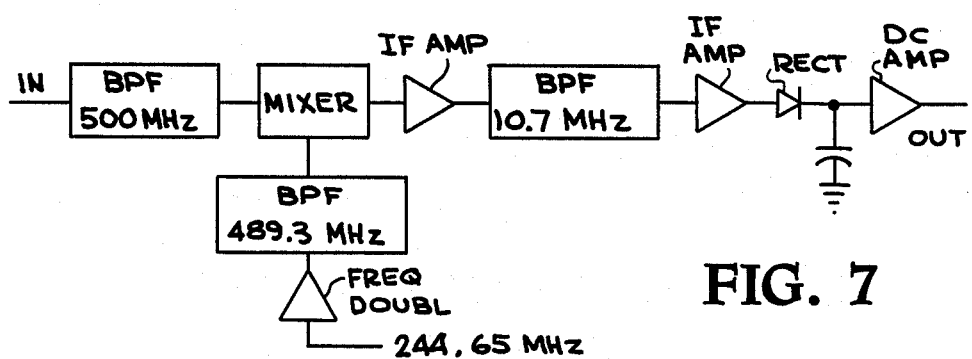
FIG. 7 is a schematic view of typical detection circuitry into which the signal from the sensing means of the invention may be fed.

The signal from the sensing means of the invention may be fed into a band pass filter (BPF) as shown in the schematic of FIG. 7 where the signal will then be conventionally processed without, however, exposing the filter to the high energy which would be seen at that point if the sensing means of the invention did not include self-contained frequency selection means to tune out all but the desired frequency.

Figure 2:
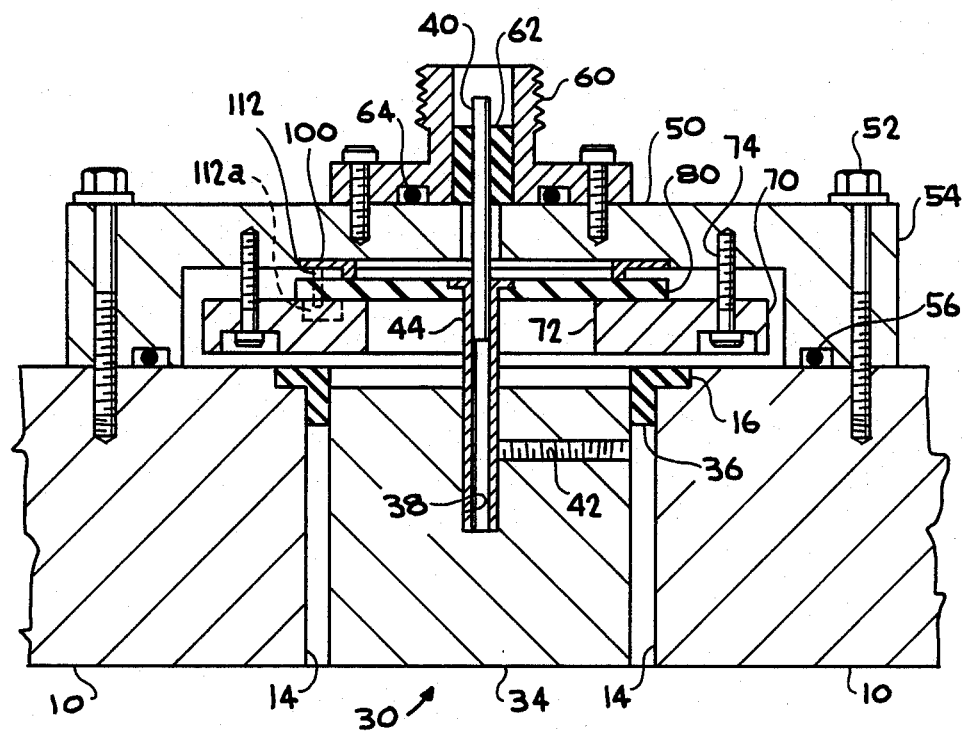
FIG. 2 is a vertical cross-sectional view of the sensing means of the invention.
Figure 3:
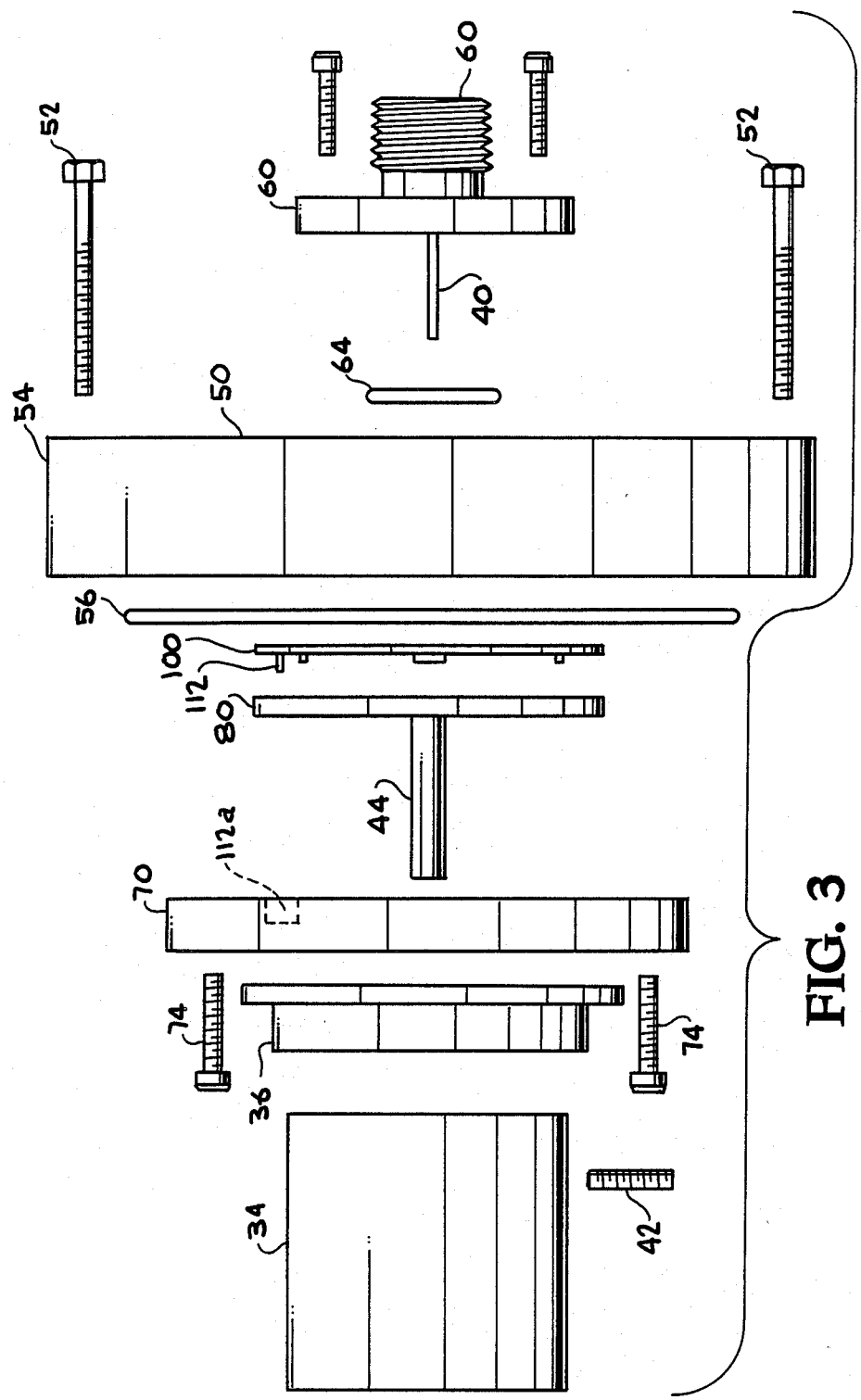
FIG. 3 an vertical cross-sectional exploded view of the sensin illustrated in FIG. 2.

Turning now to FIGS. 2 and 3, the sensing means 30 of the invention is shown in more detail comprising a cylindrical metal button or electrode 34 which fits into a bore 14 in the wall of beam pipe 10. A spacer 36 in an oversized bore 16 in beam pipe 10 maintains a predetermined air gap between the sidewalls of button 34 and bore 14 to provide a predetermined capacitance. For example, in a specific embodiment wherein the thickness of beam pipe 10 is 1 inch, a 1 inch diameter button with a 20 mil air gap between button 34 and the sidewall of bore 14 will provide a capacitance of 45–50 picofarads when the spacer is made of nylon and the length that the spacer protrudes into bore 14 is 0.25 inch or less. This amount of capacitance is needed to maintain the desired Q level of the circuit.

Spacer 36 comprises a material which will provide good insulation and a minimum of outgassing under vacuum. Nylon or polystyrene comprise suitable materials. Preferably, however, spacer 36 will comprise a ceramic material such as alumina.

Button 34 is secured by a set screw 42 to a shaft 40 which is received in a central bore 38 in button 34. Shaft 40 serves to provide both mechanical support for button 34 and electrical communication to an external electrical connector 60 which is, in turn, mounted in vacuum-tight relationship to a housing 50 using, for example, an o-ring seal 64 or by welding the connector to housing 50. Electrical connector 60 is a vacuum-tight coaxial cable type connector with the central conductor separated from the case or ground electrode by an insulator 62.

Housing 50 is secured to beam pipe 10 through bolts 52 which pass through a depending shoulder 54 on housing 50. An o-ring seal 56 is provided between shoulder 54 and beam pipe 10 to maintain the vacuum within the system.

Mounted beneath housing 50 and having a diameter smaller than the I.D. of shoulder 54 is a washer 70 which provides a base or support for an insulated disc 80 which contains serpentine or hairpin-like inductance paths as will be described below.

Washer 70 is provided with a central bore 72 which permits it to loosely fit around a metal sleeve 44 which is secured to the underside of insulated disc 80 and to button 34. Metal sleeve 44 may be formed integral with button 34 if desired. Washer 70 is insulatively spaced from button 34 by oversized bore 72 and spacer 36. Bolts 74 secure washer 70 to the underside of housing 50.

Insulated disc 80 may comprise any suitable insulation material on which conductive strips may be mounted. Conveniently, insulation disc will comprise a material such as, for example, Kapton, a polyimide type plastic material available from the DuPont Company, on which the metal inductor paths may be formed using conventional printed circuit board technology.

Figure 4:
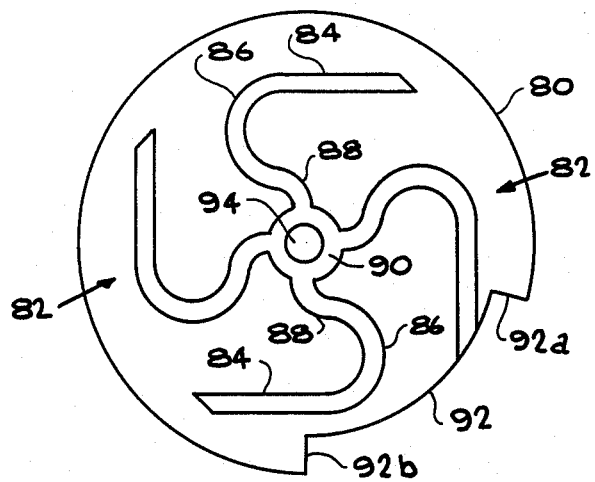
FIG. 4 view of one of the components of the variable inductor means associated with the sensing means of the invention.

Turning now to FIG. 4, four metal inductor paths are generally shown at 82 as formed on insulation disc 80. Each inductor path 82 is, in the preferred embodiment, fashioned in a serpentine or hairpin-like shape and comprises a straight outer portion or strip 84, a first curved portion 86, and a reverse curve portion 88 terminating in a central metal collar 90 formed around a central bore 94 in insulation disc 80. While the number of inductor paths need not always be four in number, it is preferable to have more than one path and even more preferable to have at least three or more paths to provide a more balanced current path for the inductive circuit as it oscillates for a more uniformly distributed current in a radial direction.

It should be further noted that the inductor paths could be straight instead of serpentine if a lower inductance is required. However, it is preferred to provide serpentine paths to provide longer inductance paths per unit of diameter of insulated disc 80.

Each of the inductor paths 82 makes electrical contact with central metal collar 90. Collar 90 is, in turn, electrically connected to sleeve 44 which is fastened to the underside of insulation disc 80. This establishes electrical communication between the inductor paths 82 and button electrode 34. Electrical connection between collar 90 on the top surface of insulated disc 80 and sleeve 44 on the underside of disc 80 may be conveniently accomplished by plating the sidewalls of central bore 94 of disc 80.

The serpentine inductor paths may comprise copper strips formed using well known printed circuit board technology to provide metal strips having a thickness of about 1-1.5 mils, and a width of about 60 mils. The copper strips may be plated with gold or similar conductor to provide better contact as well as to inhibit oxidation of the copper. While the length of the inductor paths will vary depending upon the amount of inductance required, in a preferred embodiment the total length of each inductor path 82 is selected to be about 1 to 1.25 inches to provide a total inductance of the parallel inductors of about 2 nanohenries. This amount of inductance will provide, in combination with the capacitance between beam pipe 10 and button 34, an LC combination that may be varied or fine tuned to resonate at 500 MHz.

The 500 MHz frequency is selected in the disclosed embodiment because a 500 MHz signal is initially used to excite or stimulate the beam of charged particles and thus there will always be a 500 MHz Fourier component in the charged particle beam which may be sensed.

Figure 5:
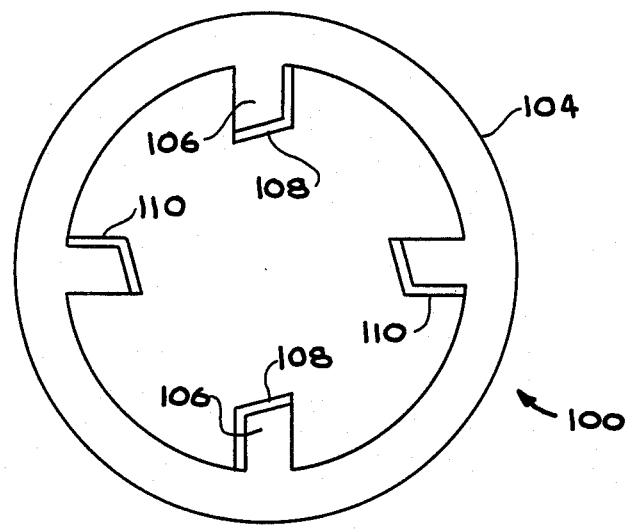
FIG. 5 is a top view of the other component of the variable inductor means associated with the sensing means of the invention.

The effective inductance of the inductive paths or strips 82 is varied by rotationally contacting each of the paths 82 respectively with a contact finger or wiper which is connected to ground as will now be explained by referring to FIG. 5. FIG. 5 shows a metal contact ring 100 which is also seen in the exploded view of FIG. 3 in which it can be seen that ring 100 is mounted to the underside of metal housing 50 to effectively ground contact ring 100 through housing 50 to beam pipe 10.

Contact ring 100 comprises an outer ring 104 from which inwardly depend sawtooth-like kerfs forming contact fingers 106 each having a raised tapered portion 108 and a raised straight portion 110. Raised portions 108 and 110 protrude out from the surface of contact ring 100 to provide the contact edges which will respectively contact the serpentine conductive paths of the inductors 82 to change the effective electrical length of inductors 82 when either contact ring 100 or insulated disc 80 is rotated with respect to the other member. The inductance of the relatively broad contact fingers is much less than that of the narrow inductor paths which are being shorted out.

Figure 6A:
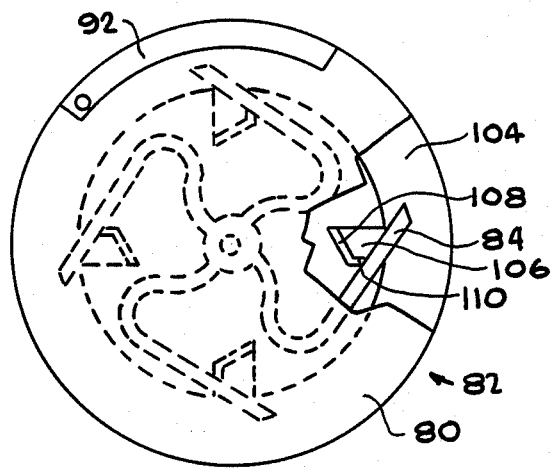
FIGS. 6a–6c views of the variable inductor means shown respectively in different positions to show the variations in the length of the serpentine inductor paths.
Figure 6B:
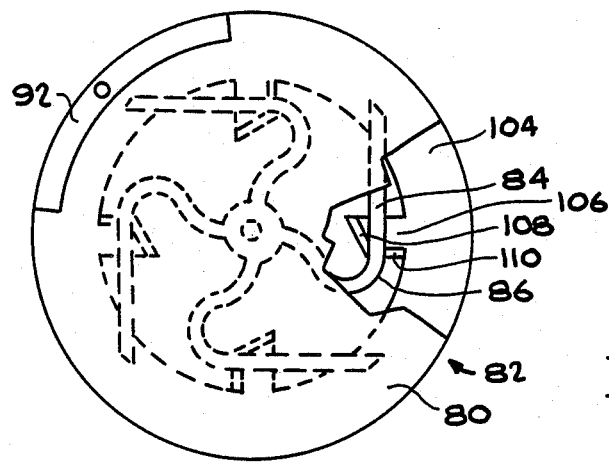
Figure 6C:
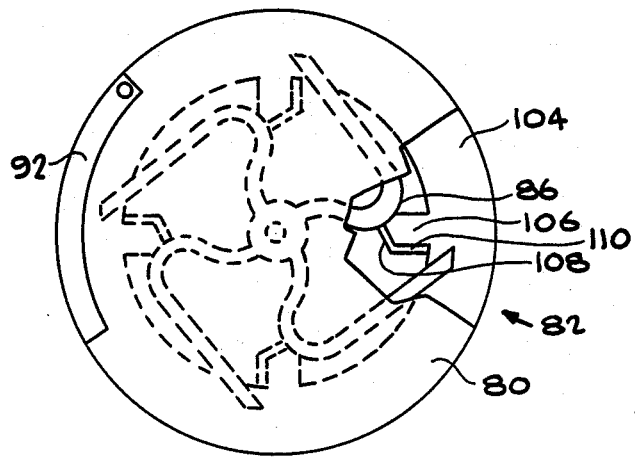

As shown in FIGS. 6a-6c, rotation of either insulated disc 80 or contact ring 100 results in a variation where either raised portion 108 or 110 contacts the respective inductor path 82 to thereby lengthen or shorten the inductive path to fine tune the sensing means to the desired frequency. To permit such rotation, set screw 42 is loosened to permit button 34 to rotate and bolts 74 are loosened so that insulated disc 80 and contact ring 100 may rotate with respect to one another.

In FIG. 6a, raised straight portion 110 of each of the contact fingers 106 on contact ring 100 is in contact with the end of the straight portion 84 of each serpentine inductor 82 on insulated disc 80 to provide maximum inductance paths for each of the inductors. However, when contact ring 100 and insulated disc 80 are rotated with respect to each other, the effective electrical path is shortened as shown in FIG. 6b so that the section of straight portion 84 of each serpentine inductance path closest to curve 86 is in contact with raised straight contact finger portion 110.

FIG. 6c illustrates further rotation of insulated disc 80 with respect to contact ring 100 wherein the raised tapered portion 108 of contact finger 106 is now in contact with the curved portion 86 of the inductive paths to still further shorten the inductive paths.

The orientation of serpentine inductance paths 82 on insulated disk 80 in FIG. 4 is opposite to the orientation shown in FIGS. 6a-6c. This is because FIGS. 6a-6c show insulated disk 80 and serpentine inductance paths 82 thereon turned over with the face of insulated disk 80 against contact ring 100.

It should be noted with regard to the provision of serpentine inductor paths versus straight paths that if inductor paths 82 would radiate out from collar 90 in a noncurved arrangement, it would be necessary to extend the tapered portion 108 of contact finger 106 to provide the desired change in the length of the inductance path to achieve the desired adjustment of the inductance of the sensing means.

In the tuning of the sensing means, if insulated disc 80 and contact ring 100 are rotated too far with respect to one another, the respective contact finger could come in contact with the next inductor. To prevent this and limit the extent of travel, a cutaway section 92 is provided in the outer periphery of insulated disc 80 as shown in FIG. 4. A corresponding pin 112 on conductor ring 100, as seen in FIG. 3, contacts the end edges 92a and 92b of cutaway section 92 to limit the extent of rotation as well as to provide a ready indication that a maximum or minimum point has been reached in the adjustment. It should be noted, in this regard, that there is a corresponding cutout or relief 112a provided in washer 70 beneath cutaway section 92 in insulated disc 80 to accommodate pin 112. If desired, calibration markings may be made on button 34 or any other appropriate place once the initial tuning is done.

After tuning of the sensing means, and retightening of bolts 74 and setscrew 42, the 500 MHz signal is passed to the detection circuitry such as the typical circuitry shown in FIG. 7 where the signal may be processed without the deleterious effects on the circuit components experienced by the prior art.

Thus the invention provides an improved sensing means to sense the location of a beam of charged particles in a storage ring wherein the sensing means are tuned to a particular Fourier frequency component both by design of the elements comprising the sensing means and the provision of self-contained fine tuning means to vary the inductance by varying the effective path length of a plurality of inductor strips contained within the sensing means. The result is a tunable frequency domain signal instead of the prior art time domain pickup pulse and thus excessive pulse heights from the pickup electrode or sensing means and unwanted high frequency components from the pulses are not carried by the signal cables.

While a specific embodiment of the improved sensing means has been illustrated and described in accordance with this invention, modifications and changes of the apparatus, parameters, materials, etc. will become apparent to those skilled in the art, and it is intended to cover in the appended claims all such modifications and changes which come within the scope of the invention.

What is claimed is:

1. A frequency domain sensing system for sensing the position of a high energy beam of charged particles traveling within a housing which comprises a plurality of sensings means positioned on the housing radially around the axis of the beam, each of said sensing means further comprising a first electrode means of predetermined shape and spacing from said housing to define a fixed capacitance, inductance means attached to said electrode to provide an inductance for said sensing means which will provide an LC circuit which will resonate at a predetermined frequency known to exist in said beam of charged particles, and means carried by said sensing means to vary the amount of said inductance to tune said sensing means to said predetermined frequency.

2. The frequency domain sensing system of claim 1 wherein said inductance means comprises a plurality of strip inductors each having a first end electrically communicating with said electrode.

3. The frequency domain sensing system of claim 2 wherein contact fingers carried on a ring mounted to said sensing system and rotatable with respect to said electrode and said strip inductors contact said strip inductors to change the effective electrical length of said inductors as said ring and said electrode are rotated with respect to one another.

4. The frequency domain sensing system of claim 3 wherein said plurality of inductors comprises at least three inductor strips radially spaced around a central collar on an insulated disc which is mechanically attached to said electrode and said contact finger ring is mounted coaxial to said disc with a corresponding number of contact fingers to provide one contact finger in contact with each of said strip inductors.

5. The frequency domain system of claim 4 wherein said strip inductors are serpentine in shape leading from said central collar with a first curved portion leading from said central collar, a reverse curve portion, and terminating in a straight portion substantially perpendicular to a radius extending from said central collar.

6. The frequency domain system of claim 5 wherein each of said contact fingers comprises a first straight portion inwardly depending toward the center of said ring along a radius of said ring a sufficient distance with respect to the shape of said serpentine strip inductors to permit engagement of at least a part of said curved portion of said strip inductor upon rotation of said ring and said electrode with respect to one another and a tapered end portion on said contact finger positioned to be engagable with said straight portion of said serpentine inductor whereby rotation of said electrode and said disc containing said strip inductors with respect to said contact finger ring will cause said contact fingers to respectively engage said strip inductors at different points along the strip to progressively increase or decrease the effective electrical path of said strip inductors depending upon the direction of rotation.

7. Sensing means for a frequency domain sensing system to determine the position of a high energy beam of charged particles traveling within a housing which comprises:
   (a) a first cylindrical electrode means of predetermined dieameter and spacing from said housing to define a fixed capacitance;
   (b) central shaft means affixed to said cylindrical electrode to mechanically secure said electrode and provide electrical communication to a coaxially connector mounted externally on said sensing means;
   (c) inductance means comprising an insulated disc physically attached to said electrode and having a plurality of strip inductors radially spaced around the center of said disc on a surface thereon facing away from said electrode;
   (d) a mounting plate having a circular contact ring mounted thereon coaxially with said insulated disc;
   (e) a plurality of contact fingers on said circular contact ring radially depending inward some the circumference of said ring and in registry with said strip inductors whereby each of said contact fingers is in electrical contact with a portion of a corresponding strip inductor, each of said contact fingers being shaped, with respect to the shape of said strip inductors, to permit said contact finger to contact a different portion of said respective strip inductor when said circular electrode and said insulated disc containing said strip inductors rotated to thereby shorten or lenghten the effective electrical length of said strip inductors to vary the inductance of said sensing means;

whereby said sensing means contains a tunable inductance which, in combination with the capacitance of said electrode, will provide an LC circuit which will be resonant at a predetermined frequency known to exist in said beam of charged particles.

8. The sensing means of claim 7 wherein each of said strip inductors are serpentine in shape leading from a central metal collar on said insulated disc which is attached to said electrode, said serpentine strip inductors each having with a first curved portion leading from said central collar connecting with a reverse curve portion and terminating in a straight portion substantially perpendicular to a radius extending from said central collar.

9. The sensing means of claim 8 wherein each of said contact fingers on said contact ring comprises a first straight portion inwardly depending toward the center of said ring along a radius of said ring a sufficient distance with respect to the shape of said serpentine strip inductors to permit engagement of at least a part of said curved portion of said strip inductor and a tapered end portion on said contact finger positioned to engage said straight portion of said serpentine inductor whereby rotation of said disc containing said strip inductors with respect to said contact finger ring will cause said contact fingers to engage said strip inductors at different points along the strip to progressively increase or decrease the effective electrical path of said strip inductors depending upon the direction of rotation.

10. A method for determining the position of a high energy beam of charged particles traveling in a housing which comprises:
   (a) positioning a plurality of sensing means in said housing radially around the general axis of said beam;
   (b) sensing a predetermined frequency component of said beam by providing a LC circuit in each of said sensing means comprising a sensing electrode of predetermined size to provide the capacitance of said LC circuit and a series of strip inductors electrically and mechanically attached to said electrode to provide a predetermined range of inductance for said LC circuit; and
   (c) tuning said circuit in said sensing means by contacting said strip inductors with means to change the effective electrical length of said strip inductors to thereby vary the amount of inductance in said sensing means.

* * * * *